(12) United States Patent
Umemoto et al.

(10) Patent No.: US 7,416,963 B2
(45) Date of Patent: Aug. 26, 2008

(54) MANUFACTURING METHOD OF SEMICONDUCTOR DEVICE

(76) Inventors: Mitsuo Umemoto, 5-5 Keihan-Hondori 2-Chome, Moriguchi-shi, Osaka (JP); Yoshio Okayama, 718 Old San Francisco Rd., #353, Sunnyvale, CA (US) 94086; Kazumasa Tanida, 9-2-207, Azumakami-cho, Kashiwa-shi, Chiba (JP); Hiroshi Terao, c/o NEC Corporation 7-1, Shiba 5-chome, Minato-ku, Tokyo (JP); Yoshihiko Nemoto, c/o Renesas Technology Corp. Marunouchi Bldg, 2-4-1, Marunouchi Chiyoda-ku, Tokyo (JP)

( * ) Notice: Subject to any disclaimer, the term of this patent is extended or adjusted under 35 U.S.C. 154(b) by 508 days.

(21) Appl. No.: 11/182,055

(22) Filed: Jul. 15, 2005

(65) Prior Publication Data

US 2006/0033168 A1 Feb. 16, 2006

(30) Foreign Application Priority Data

Jul. 16, 2004 (JP) ............................. 2004-210216

(51) Int. Cl.
*H01L 21/00* (2006.01)
*H01L 21/44* (2006.01)
*H01L 29/40* (2006.01)
*H01L 23/52* (2006.01)
*H01L 23/48* (2006.01)

(52) U.S. Cl. .................. 438/461; 438/667; 257/737; 257/621

(58) Field of Classification Search .................. 438/106, 438/667, 612, 614, 460, 461; 257/621, E23.174
See application file for complete search history.

(56) References Cited

U.S. PATENT DOCUMENTS

| 6,844,627 B2 | 1/2005 | Lee et al. | |
| 2004/0137701 A1* | 7/2004 | Takao | 438/461 |
| 2004/0212086 A1* | 10/2004 | Dotta et al. | 257/737 |
| 2005/0009329 A1* | 1/2005 | Tanida et al. | 438/667 |

FOREIGN PATENT DOCUMENTS

| CN | 1482655 | 3/2004 |
| JP | 2003-309221 | 10/2003 |

* cited by examiner

*Primary Examiner*—Ha Nguyen
*Assistant Examiner*—Valerie Brown
(74) *Attorney, Agent, or Firm*—Morrison & Foerster LLP

(57) ABSTRACT

This invention offers a manufacturing method to reduce a manufacturing cost of a semiconductor device having a through-hole electrode by simplifying a manufacturing process and to enhance yield of the semiconductor device. A first insulation film is formed on a top surface of a semiconductor substrate. A part of the first insulation film is etched to form an opening in which a part of the semiconductor substrate is exposed. Then a pad electrode is formed in the opening and on the first insulation film. A second insulation film is formed on a back surface of the semiconductor substrate. Then a via hole having an aperture larger than the opening is formed. And a third insulation film is formed in the via hole and on the second insulation film. The third insulation film on a bottom of the via hole is etched to expose the pad electrode. After that, a through-hole electrode and a wiring layer are formed in the via hole. Finally, the semiconductor substrate is cut and separated into a plurality of semiconductor dice.

14 Claims, 13 Drawing Sheets

MANUFACTURING METHOD OF SEMICONDUCTOR DEVICE

CROSS-REFERENCE OF THE INVENTION

This invention is based on Japanese Patent Application No. 2004-210216, the content of which is incorporated herein by reference in its entirety.

BACKGROUND OF THE INVENTION

1. Field of the Invention

This invention relates to a manufacturing method of a semiconductor device, specifically to a manufacturing method of a semiconductor device having a through-hole electrode.

2. Description of the Related Art

A CSP (Chip Size Package) has received attention in recent years as a three-dimensional mounting technology as well as a new packaging technology. The CSP means a small package having about the same outside dimensions as those of a semiconductor die packaged in it.

A BGA type semiconductor device with a through-hole electrode has been known as a kind of CSP. This BGA type semiconductor device has a through-hole electrode that penetrates through a semiconductor substrate and is connected with a pad electrode. And a plurality of ball-shaped conductive terminals made of metal such as solder is arrayed in a grid pattern on a back surface of the semiconductor device.

When the semiconductor device is incorporated into electronic equipment, each of the conductive terminals is connected to a wiring pattern on a circuit board such as a printed circuit board.

Such a BGA type semiconductor device has advantages in providing a large number of conductive terminals and in reducing size over other CSP type semiconductor devices such as an SOP (Small Outline Package) and a QFP (Quad Flat Package) that have lead pins protruding from their sides.

Next, a conventional manufacturing method of the BGA type semiconductor device with the though-hole electrode will be described referring to the drawings. FIGS. 24-27 are cross-sectional views showing the conventional manufacturing method of the semiconductor device.

First, a pad electrode 52 is formed on a top surface of a semiconductor substrate 50 through a first insulation film 51, as shown in FIG. 24. Next, a supporting body 54 is bonded to the top surface of the semiconductor substrate 50 through a resin layer 53, when necessary.

Next, a second insulation film 55 is formed on a back surface of the semiconductor substrate 50 and a photoresist layer 80 is selectively formed on the second insulation film 55. The photoresist layer 80 has an opening at a location corresponding to the pad electrode 52. A via hole 56, which penetrates through the semiconductor substrate 50 and the second insulation film 55 and exposes the first insulation film 51, is formed by etching the second insulation film 55 and the semiconductor substrate 50 using the photoresist film 80 as a mask.

Furthermore, the first insulation film 51 exposed at a bottom of the via hole 56 is removed by etching using the photoresist layer 80 as a mask, as shown in FIG. 25.

Next, a third insulation film 57 is formed on a surface of the via hole 56 and on the second insulation film 55, as shown in FIG. 26.

Then the third insulation film 57 on the bottom of the via hole 56 is removed by etching from the back surface of the semiconductor substrate 50 to expose the pad electrode 52, as shown in FIG. 27.

Furthermore, a through-hole electrode (not shown) that is connected with the pad electrode 52 is formed in the via hole 56. And a wiring layer (not shown) connected with the through-hole electrode is formed on the back surface of the semiconductor substrate 50. A protection layer (not shown) is formed over the back surface of the semiconductor substrate 50 including the wiring layer. Then a portion of the protection layer is removed to expose a portion of the wiring layer, and a conductive terminal (not shown) is formed on the portion of the wiring layer. After that, the semiconductor substrate 50 is separated into a plurality of semiconductor dice by dicing.

Further description on the technologies mentioned above is disclosed in Japanese Patent Application Publication No. 2003-309221, for example.

In the conventional manufacturing method of the semiconductor device described above, however, the third insulation film 57 is formed after the pad electrode 52 is exposed by etching the first insulation film 51 on the bottom of the via hole 56 as shown in FIG. 25, and then the pad electrode 52 is exposed once again by etching the third insulation film 57 on the bottom of the via hole 56 as shown in FIG. 27. That is, two times of etching are required to expose the pad electrode 52 at the bottom of the via hole 56 while keeping the third insulation film 57 on a side wall of the via hole 56.

In addition, there is a problem that corners of the semiconductor substrate 50 are exposed at the bottom of the via hole because of convergence of electric field and over etching at the corners during the etchings to remove the first insulation film 51 and the third insulation film 57 on the bottom of the via hole 56. As a result, insulation failure is caused later between the through-hole electrode (not shown) formed in the via hole 56 and the semiconductor substrate 50.

In order to avoid the insulation failure between the through-hole electrode and the semiconductor substrate 50, the etchings must be controlled very carefully so that amounts of etching of the first insulation film 51 and the third insulation film 57 are kept as small as possible, while the pad electrode 52 is securely exposed. This makes process in the manufacturing method of the semiconductor device complicated, raising a problem of increased manufacturing cost.

And when the etching of the first insulation film 51 is insufficient, there arises a problem of electrical connection failure between the pad electrode 52 and the through-hole electrode (not shown) to be formed in the via hole 56. This reduces yield of the semiconductor device.

SUMMARY OF THE INVENTION

The invention provides a method of manufacturing a semiconductor device. The method includes forming a first insulation film on a front surface of a semiconductor substrate, forming an opening in the first insulation film by etching so as to expose part of the front surface of the semiconductor substrate, forming a pad electrode that is disposed in the opening and on the first insulation film, forming a second insulation film on a back surface of the semiconductor substrate, forming a via hole that penetrates through the second insulation film and the semiconductor substrate so as to expose part of the pad electrode disposed in the opening of the first insulation film and part of the first insulation film surrounding said part of the pad electrode disposed in the opening of the first insulation film, forming a third insulation film on a sidewall and a bottom of the via hole and on the second insulation film, etching the third insulation film so as to expose the part of the pad electrode disposed in the opening of the first insulation film, forming a through-hole electrode in the via hole that is electrically connected with the pad electrode, and dividing the semiconductor substrate to form at least a semiconductor die.

As an alternative, a barrier layer is formed in the opening of the first insulation film so that the pad electrode is in contact with the semiconductor substrate via the barrier layer. As another alternative, the first insulation film is etched, not to form the opening, but to form a recess so as to prevent the pad electrode formed in the recess from being in direct contact with the semiconductor substrate. The first insulation film at the bottom of the recess is removed when the third insulation film is removed. Yet, as another alternative, the opening of the first insulation film is formed to exposed part of a device element formed on the semiconductor substrate. The device element at the opening is removed when the third insulation film is removed.

DETAILED DESCRIPTION OF THE INVENTION

Figure 1:
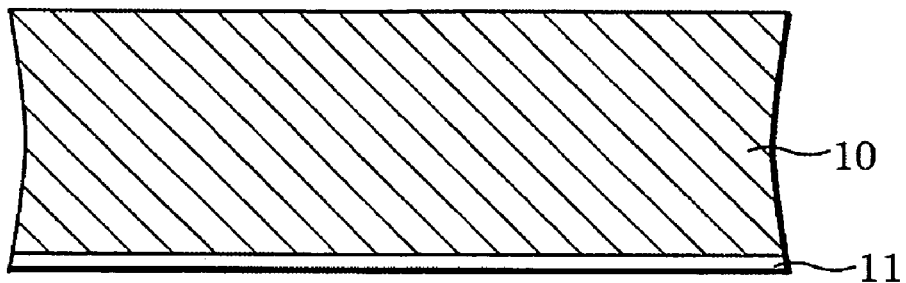
FIG. 1 is a cross-sectional view showing a device intermediate of a semiconductor device at a process step of a first embodiment of manufacturing method of this invention.

Next, a manufacturing method of a semiconductor device according to a first embodiment of this invention will be explained hereinafter, referring to the drawings. FIGS. 1-11 are cross-sectional views showing the manufacturing method of the semiconductor device according the first embodiment.

Note that FIGS. 1-11 show a region of a semiconductor substrate around a dicing line (not shown).

First, the semiconductor substrate 10 having an electronic device (not shown in the drawings) formed in its top surface is provided, as shown in FIG. 1. The electronic device is a light receiving device, such as a CCD (Charge Coupled Device) and an infrared sensor, or a light emitting device. Or the electronic device may be an electronic device other than the light receiving device or light emitting device mentioned above. And the semiconductor substrate 10 is made of silicon. However, it may be made of other material. The semiconductor substrate 10 has a thickness of about 130 µm preferably.

Next, a first insulation film 11, that is an interlayer insulation film, is formed on the top surface of the semiconductor substrate 10 having the electronic device thereon. The first insulation film 11 is made of a P-TEOS (Plasma-Tetra-Ethyl-Ortho-Silicate) film or a BPSG (Boro-Phospho-Silicate-Glass) film, for example. And the first insulation film 11 is formed to have a thickness of 0.8 µm preferably.

Figure 2:
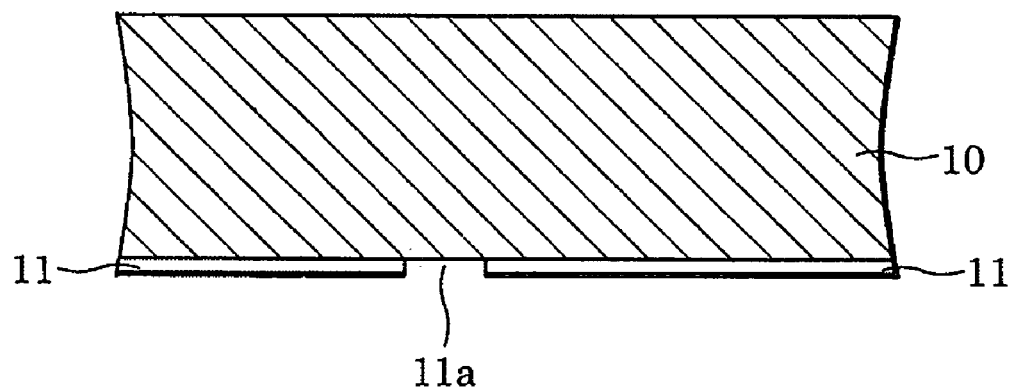
FIGS. 2-11 are cross-sectional views showing respective device intermediates at process steps following the process step of FIG. 1 and arranged in the sequence of the first embodiment of manufacturing method.

Next, a portion of the first insulation film 11 in contact with the top surface of the semiconductor substrate 10 is selectively etched and removed, as shown in FIG. 2. The portion mentioned above is situated at a location corresponding to a location on the semiconductor substrate 10 where a via hole is to be formed. The etching forms an opening 11a in which a portion of the top surface of the semiconductor substrate 10 is exposed.

Figure 3:
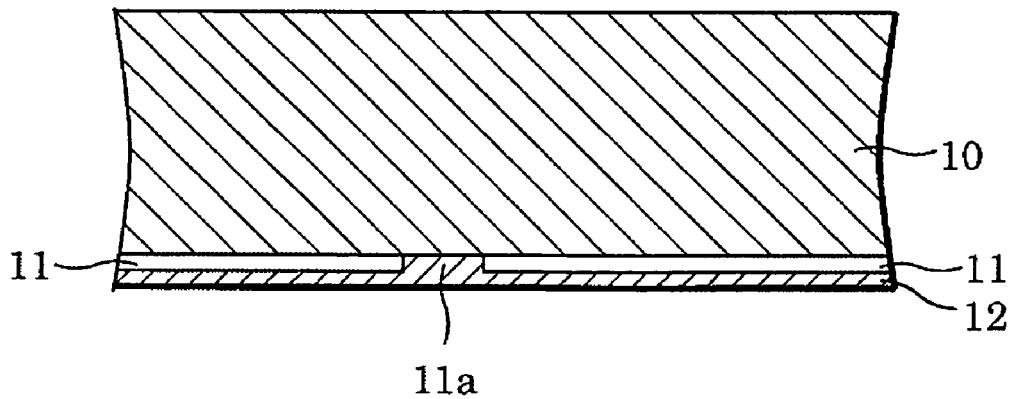

Next, a pad electrode 12, that is connected with the electronic device and serves as an electrode for external connection, is formed on the first insulation film 11 and in the opening 11a, as shown in FIG. 3. Although the pad electrode 12 is preferably an aluminum (Al) electrode formed by sputtering, it may be an electrode made of other metal The pad electrode 12 is formed to make contact with the semiconductor substrate 10 at a bottom of the opening 11a and extend from inside of the opening 11a onto the first insulation film 11. And the pad electrode 12 is formed to have a thickness of 1 µm preferably.

Figure 4:
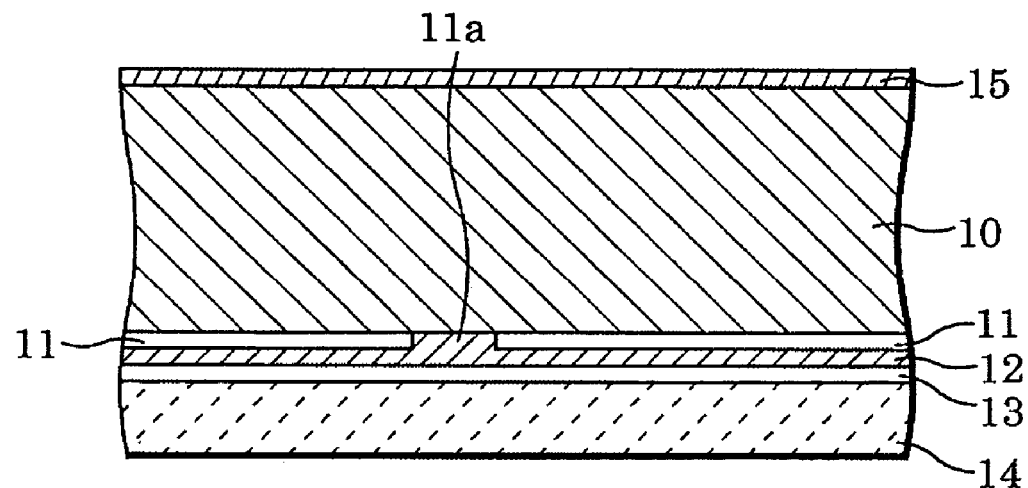

Next, a supporting body 14 is formed on the pad electrode 12 through a resin layer 13, as shown in FIG. 4. The supporting body 14 is made of a transparent or semitransparent material such as a glass when the electronic device is a light receiving device or a light emitting device. The supporting body 14 may be made of material other than the transparent or semitransparent material when the electronic device is not a light receiving device or a light emitting device. The supporting body 14 may be in a form of a tape. The supporting body 14 may be removed in a later process step. Or, the supporting body 14 may remain without being removed. Forming the supporting body 14 is not necessarily required and may be omitted.

Next, a second insulation film 15, that serves as a back surface insulation film, is formed on a back surface of the semiconductor substrate 10. The second insulation film 15 is made of a silicon dioxide ($SiO_2$) film or a silicon nitride (SiN) film, for example, and is formed by plasma CVD, for example. And the second insulation film 15 is formed to have a thickness of about 12 µm preferably.

Figure 5:
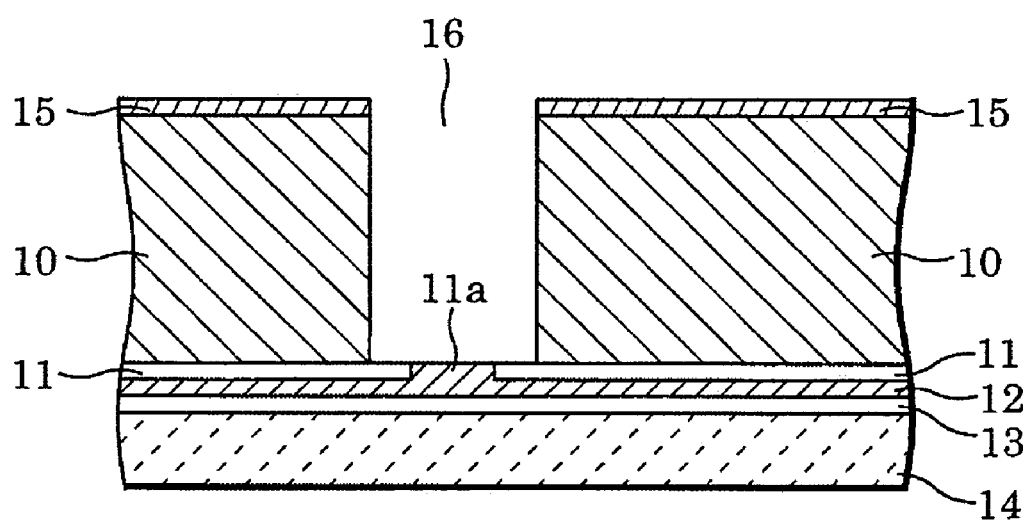

Next, as shown in FIG. 5, the second insulation film 15 and the semiconductor substrate 10 at the location corresponding to the opening 11a in the first insulation film 11 are etched using a photoresist layer (not shown) as a mask. The etching forms a via hole 16 that penetrates through the second insulation film 15 and the semiconductor substrate 10 and has an aperture larger than the opening 11a in the first insulation film 11. A portion of the first insulation film 11 and a portion of the pad electrode 12 are exposed at a bottom of the via hole 16.

Figure 6:
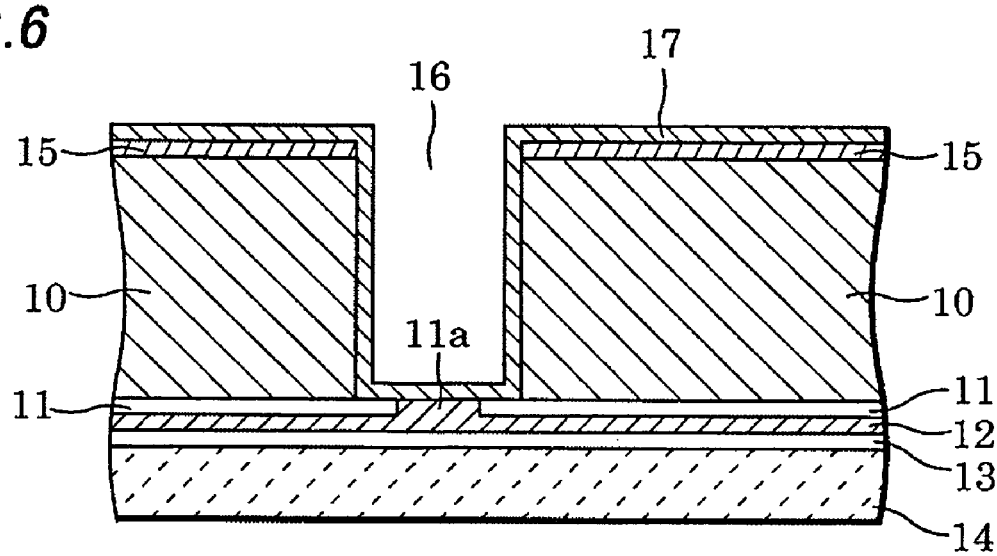

Next, a third insulation film 17 is formed on a surface of the via hole 16 and on the second insulation film 15, as shown in FIG. 6. The third insulation film 17 is made of a silicon dioxide ($SiO_2$) film or a silicon nitride (SiN) film, for example, and is formed by plasma CVD, for example.

Figure 7:
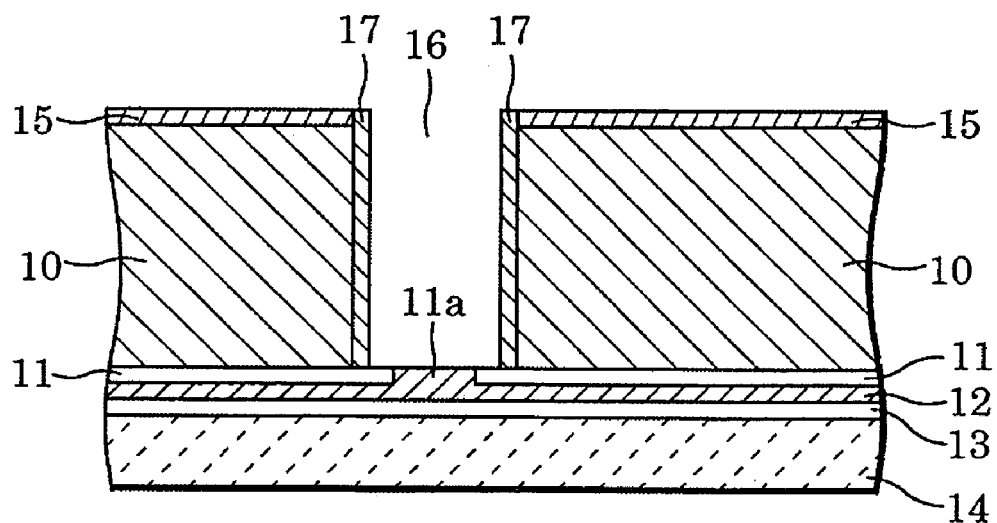

Next, the third insulation film 17 is etched from the back surface side of the semiconductor substrate 10 preferably by anisotropic dry etching, as shown in FIG. 7. The third insulation film 17 formed on the second insulation film 15 and the third insulation film 17 formed on the bottom of the via hole 16 are removed by the etching. That is, a part of the pad electrode 12 is exposed at the bottom of the via hole 16, while the third insulation film 17 formed on a side wall of the via hole 16 remains. Also, a part of the first insulation film 11 is exposed around the exposed pad electrode 12 at the bottom of the via hole 16.

A slight over-etching is required in the above-mentioned etching to make sure that the pad electrode 12 is exposed. The over-etching can be suppressed to the minimum, since the portion of the pad electrode 12 is not covered with the first insulation film 11 at the bottom of the via hole 16.

Figure 8:
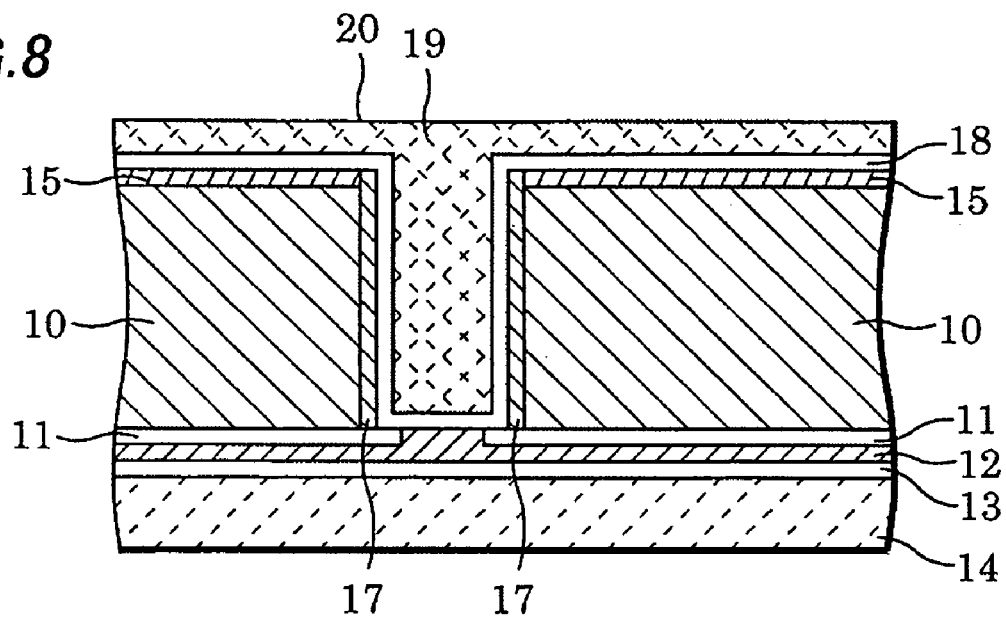

Next, a barrier/seed layer 18 is formed on the second insulation film 15 on the back surface of the semiconductor substrate 10 and on the surface of the via hole 16, as shown in FIG. 8. The barrier/seed layer 18 has a structure of stacked layers made of a barrier metal layer and a seed layer (not shown). The barrier metal layer is made of a metal layer such as a titanium-tungsten (TiW) layer, a titanium nitride (TiN) layer or a tantalum nitride (TaN) layer, for example. The seed layer is to serve as an electrode for plating to form a wiring layer 20 that will be described below, and is made of metal such as copper (Cu), for example.

The barrier/seed layer 18 is formed by sputtering, CVD, electroless plating or other film-forming method, for example.

When the third insulation film 17 on the side wall of the via hole 16 is made of the silicon nitride (SiN) film, the barrier/seed layer 18 may have a single layer structure composed only of the seed layer that is made of copper (Cu), since the silicon nitride (SiN) film serves as a barrier against copper diffusion.

Next, a through-hole electrode 19 made of copper (Cu), for example, and the wiring layer 20, that is continuous to the through-hole electrode 19, are formed on the barrier/seed layer 18, including inside of the via hole 16, by electrolytic plating, for example. The thickness of the plating is adjusted so that the through-hole electrode 19 fills the via hole 16 completely or incompletely. The through-hole electrode 19 and the wiring layer 20 are electrically connected to the pad electrode 12 exposed at the bottom of the via hole 16 through the barrier/seed layer 18.

Next, a photoresist layer (not shown), which is used to shape the wiring layer 20 into a predetermined pattern, is formed selectively on the wiring layer 20 on the back surface of the semiconductor substrate 10. The photoresist layer is formed on a region of the wiring layer 20 that is to remain corresponding to the predetermined pattern. The region of the wiring layer 20 that is to remain includes a location of the via hole 16 at least.

Figure 9:
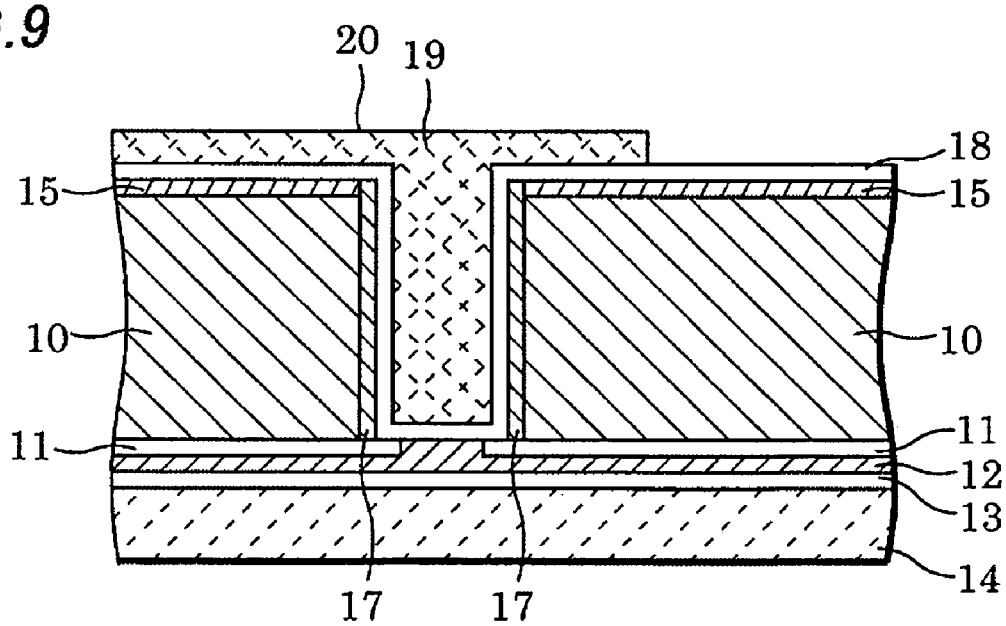

Next, unnecessary portions of the wiring layer 20 and the barrier/seed layer 18 are removed by etching using the photoresist layer as a mask, as shown in FIG. 9. Or, at least the unnecessary portions of the wiring layer 20 are removed by etching. The wiring layer 20 is shaped into the predetermined pattern of wiring by the etching.

Figure 10:
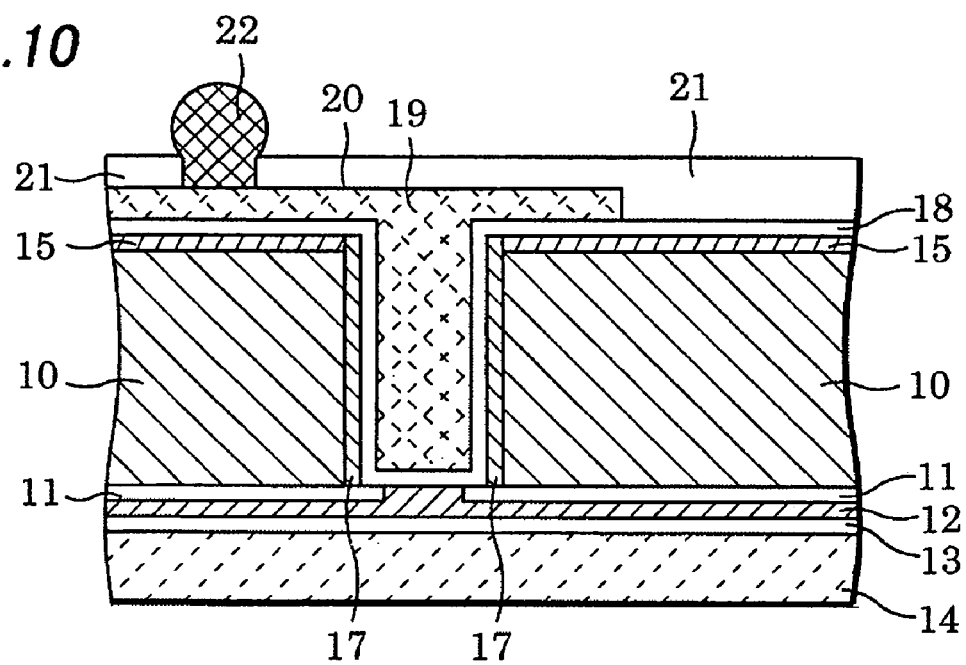

Next, after the photoresist layer is removed, a protection layer 21 made of a photoresist material, for example, is formed to cover the back surface of the semiconductor substrate 10, as shown in FIG. 10. An opening is formed in the protection layer 21 at a location on the wiring layer 20. And a ball-shaped conductive terminal 22 made of metal such as solder is formed on the wiring layer 20 exposed in the opening.

Figure 11:
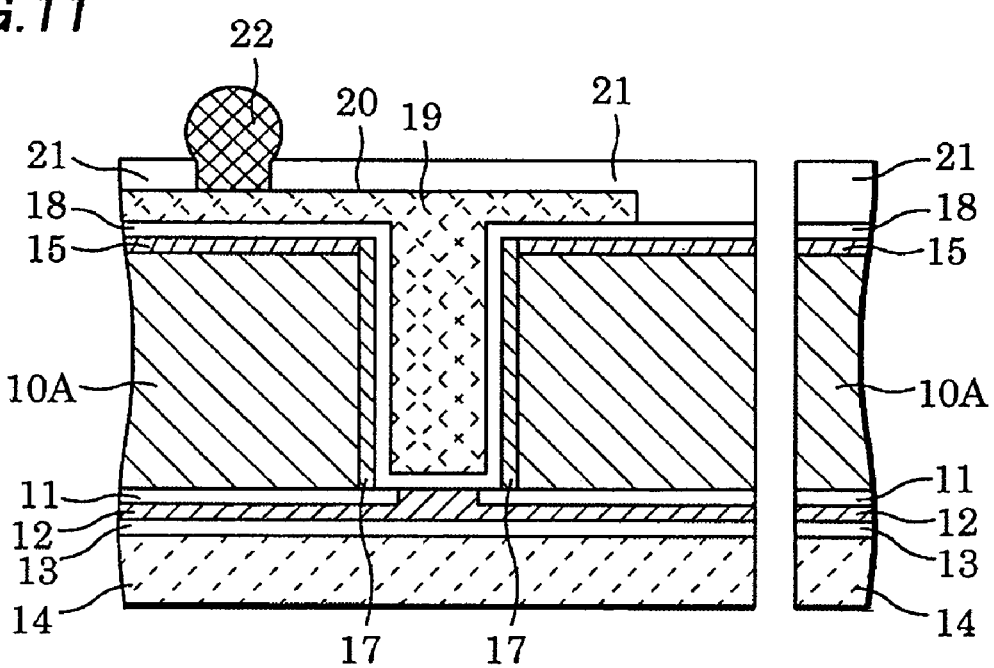

Next, the semiconductor substrate 10 and the stacked layers on it are diced and separated along a dicing line (not shown), as shown in FIG. 11. With this, a plurality of semiconductor devices composed of semiconductor dice 10A and the stacked layers is completed.

According to the manufacturing method of the embodiment, unlike the prior art, there is no need for etching the first insulation film 51 covering the pad electrode 52 at the bottom of the via hole 56 after the via hole is formed by etching the semiconductor substrate 10, as described above. Therefore, only one time of etching is enough to complete the etching to expose the pad electrode 12 at the bottom of the via hole 16. And the etching to securely expose the pad electrode 12 at the bottom of the via hole 16 can be suppressed to the minimum. That is, the control of the etching is easier than in the conventional art.

As a result, it is made possible in the manufacturing method of the semiconductor device having a through-hole electrode to reduce a manufacturing cost by simplifying the manufacturing process and to enhance yield of the semiconductor device.

Next, a manufacturing method of a semiconductor device according to a second embodiment of this invention will be explained hereinafter, referring to the drawings. FIGS. 12-15 are cross-sectional views showing the manufacturing method of the semiconductor device according the second embodiment. Note that FIGS. 12-15 show a region of a semiconductor substrate around a dicing line (not shown). The same reference numerals are used for the common components in FIGS. 12-15 as in FIGS. 1-11 referred in the explanation of the first embodiment.

Figure 12:
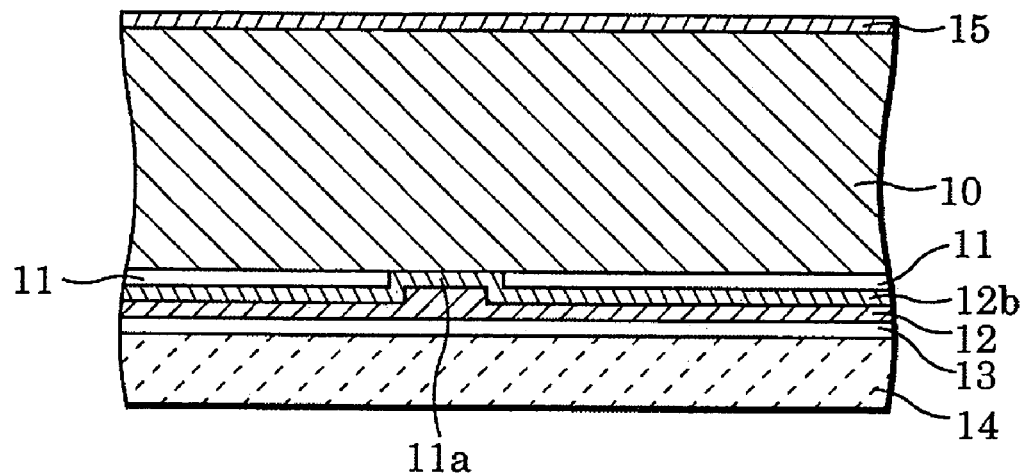
FIG. 12 is a cross-sectional view showing a device intermediate of a semiconductor device at a process step of a second embodiment of manufacturing method of this invention.

First, as shown in FIG. 12, the semiconductor substrate 10 having an electronic device (not shown) formed in its top surface is provided and a first insulation film 11 and its opening 11a are formed, as in the first embodiment.

Next, a barrier metal layer 12b is formed on the first insulation film 11 and in the opening 11a. The barrier metal layer 12b is preferably made of a metal layer such as a titanium-tungsten (TiW) layer, a titanium nitride (TiN) layer or a tantalum nitride (TaN) layer, for example. Or, the barrier metal layer 12b may be made of a metal layer other than the metal layers mentioned above. The barrier metal layer 12b is formed to make contact with the semiconductor substrate 10 at a bottom of the opening 11a and extend from inside of the opening 11a onto the first insulation film 11.

Next, a pad electrode 12 made of aluminum (Al) is formed on the barrier metal layer 12b including inside of the opening 11a by sputtering, for example. The pad electrode 12 and the semiconductor substrate 10 are not in contact with each other due to the existence of the barrier metal layer 12b. Therefore, when the semiconductor substrate 10 is made of silicon and the pad electrode 12 is made of aluminum (Al), a failure resulting from contact between the aluminum (Al) in the pad electrode 12 and the silicon (Si) in the semiconductor substrate 10, such as silicon nodules, can be prevented from occurring. And when the pad electrode is made of copper (Cu), so-called copper diffusion can be also prevented from occurring.

Next, a supporting body 14 is formed on the pad electrode 12 through a resin layer 13 when necessary, as in the first embodiment. The supporting body 14 may be removed in a later process step. Or, the supporting body 14 may remain without being removed. Forming the supporting body 14 is not necessarily required and may be omitted. A second insulation film 15 is formed on a back surface of the semiconductor substrate 10, as in the first embodiment.

Figure 13:
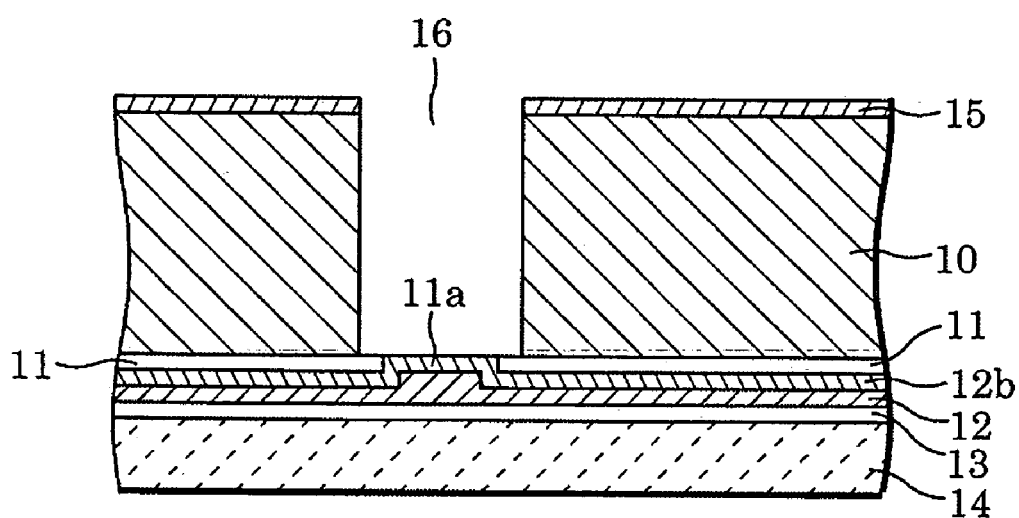
FIGS. 13-15 are cross-sectional views showing respective device intermediates at process steps following the process step of FIG. 12 and arranged in the sequence of the second embodiment of manufacturing method.

Next, as shown in FIG. 13, the second insulation film 15 and the semiconductor substrate 10 at the location corresponding to the opening 11a are etched using a photoresist layer (not shown) as a mask. The etching forms a via hole 16 that penetrates through the second insulation film 15 and the semiconductor substrate 10 and has an aperture larger than the opening 11a in the first insulation film 11. A portion of the first insulation film 11 and a portion of the barrier metal layer 12b are exposed at a bottom of the via hole 16.

Figure 14:
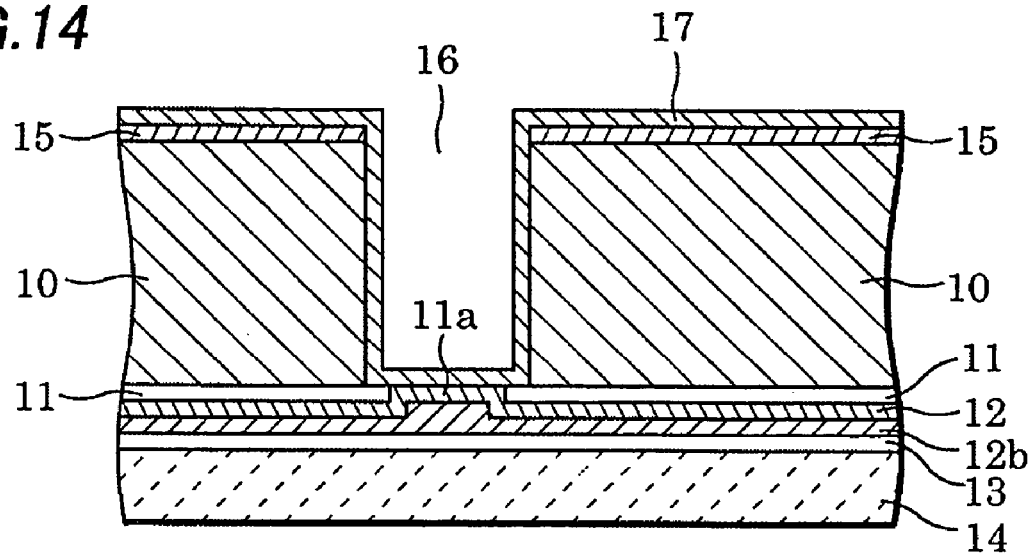

Next, as shown in FIG. 14, a third insulation film 17 is formed on a surface of the via hole 16 and on the second insulation film 15, as in the first embodiment.

Figure 15:
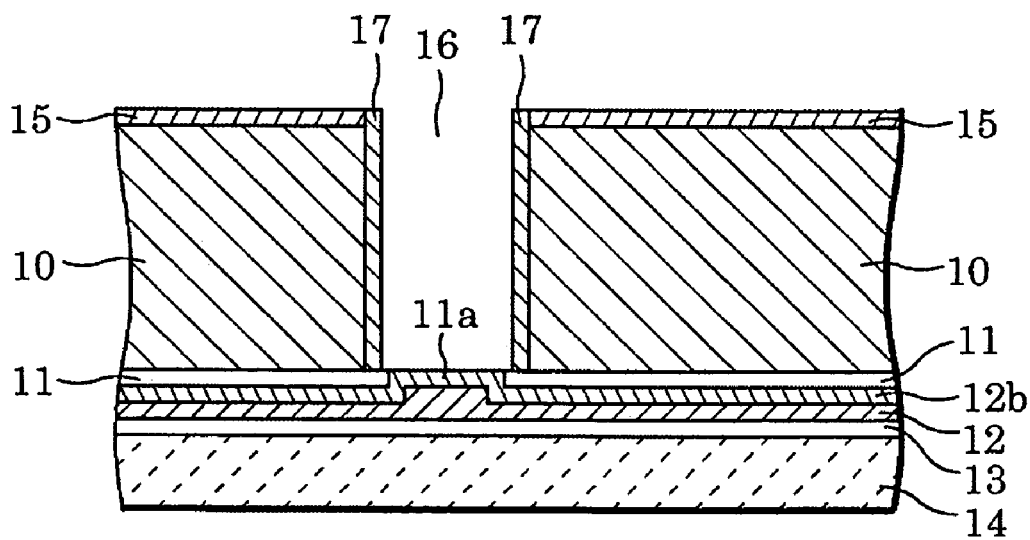

Next, as shown in FIG. 15, the third insulation film 17 is etched from the back surface side of the semiconductor substrate 10 preferably by anisotropic dry etching, as in the first embodiment. The third insulation film 17 formed on the second insulation film 15 and the third insulation film 17 formed on the bottom of the via hole 16 are removed by the etching. That is, a part of the barrier metal layer 12b is exposed at the bottom of the via hole 16, while the third insulation film 17 formed on a side wall of the via hole 16 remains. Also, a part of the first insulation film 11 is exposed around the exposed barrier metal layer 12b at the bottom of the via hole 16.

A slight over-etching is required in the above-mentioned etching to make sure that the barrier metal layer 12b is exposed. The over-etching can be suppressed to the minimum since the portion of the barrier metal layer 12b is not covered with the first insulation film 11 at the bottom of the via hole 16.

Next, a barrier/seed layer (not shown) is formed on the second insulation film 15 on the back surface of the semiconductor substrate 10 and on the surface of the via hole 16, as in the first embodiment. Furthermore, a through-hole electrode (not shown) and a wiring layer that is continuous to the through-hole electrode are formed on the barrier/seed layer (not shown), the wiring layer is shaped into a predetermined pattern and a conductive terminal (not shown) is formed on the wiring layer. The barrier/seed layer, the through-hole electrode, the wiring layer and a conductive terminal, which are not shown in the figure, are made of the same materials and formed by the same method as in the first embodiment.

Finally, the semiconductor substrate 10 and the stacked layers on it are diced and separated along a dicing line (not shown). With this, a plurality of semiconductor devices composed of semiconductor dice 10A and the stacked layers is completed.

According to the manufacturing method of the second embodiment, as described above, the pad electrode 12 and the semiconductor substrate 10 are not in contact with each other due to the existence of the barrier metal layer 12b. As a result, a failure resulting from contact between the aluminum (Al) in the pad electrode 12 and the silicon (Si) in the semiconductor substrate 10, such as silicon nodules, can be prevented from occurring.

And as in the first embodiment, unlike the prior art, there is no need for etching the first insulation film 51 covering the pad electrode 52 at the bottom of the via hole 56 after the via hole 16 is formed by etching the semiconductor substrate 10. Therefore, only one time of etching is enough to complete the etching to expose the barrier metal layer 12b at the bottom of the via hole 16. And the etching to securely expose the barrier metal layer 12b at the bottom of the via hole 16 can be suppressed to the minimum. That is, the control of the etching is easier than in the conventional art.

As a result, it is made possible in the manufacturing method of the semiconductor device having a through-hole electrode to reduce a manufacturing cost by simplifying the manufacturing process and to enhance yield of the semiconductor device.

Next, a manufacturing method of a semiconductor device according to a third embodiment of this invention will be explained hereinafter, referring to the drawings. FIGS. 16-19 are cross-sectional views showing the manufacturing method of the semiconductor device according the third embodiment. Note that FIGS. 16-19 show a region of a semiconductor substrate around a dicing line (not shown). The same reference numerals are used for the common components in FIGS. 16-19 as in FIGS. 1-11 referred in the explanation of the first embodiment.

Figure 16:
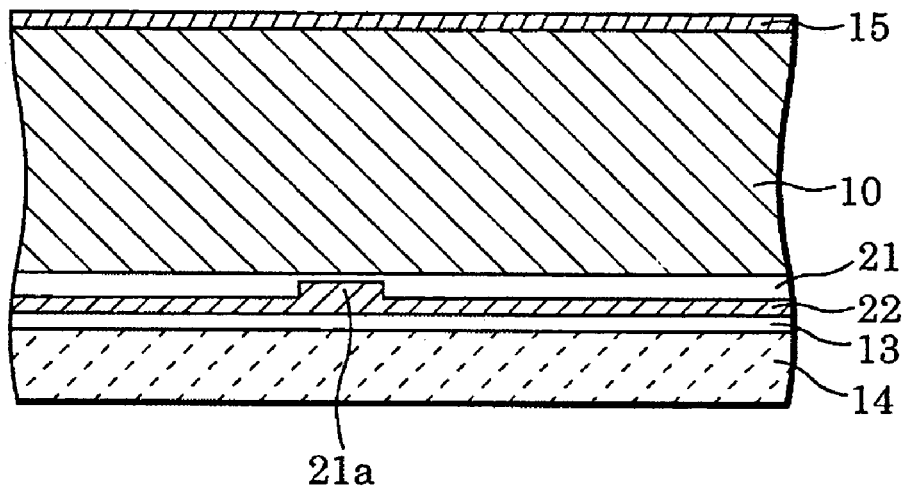
FIG. 16 is a cross-sectional view showing a device intermediate of a semiconductor device at a process step of a third embodiment of manufacturing method of this invention.

First, as shown in FIG. 16, the semiconductor substrate 10 having an electronic device (not shown) formed in its top surface is provided, as in the first embodiment. Next, a first insulation film 21 is formed on the top surface of the semiconductor substrate 10 having the electronic device (not shown) in the top surface, as in the first embodiment.

Next, a portion of the first insulation film 21 is etched selectively and partially from the top side of the semiconductor substrate to reduce a thickness of the first insulation film 21. The portion mentioned above is situated at a location corresponding to a location on the semiconductor substrate 10 where a via hole is to be formed. The etching forms a concave portion 21a in the first insulation film 21 having a bottom formed by the reduction of the thickness. The first insulation film 21 of the reduced thickness at the bottom of the concave portion 21a is in contact with the top surface of the semiconductor substrate 10.

Next, a pad electrode 22, that is connected with the electronic device and serves as an electrode for external connection, is formed on the first insulation film 21 including inside of the concave portion 21a. The pad electrode 22 is made of aluminum (Al) formed by sputtering, for example, and is formed to extend from the bottom of the concave portion 21a onto the first insulation film 21, as the pad electrode 12 in the first embodiment.

Unlike the first embodiment, the pad electrode 22 is not in contact with the top surface of the semiconductor substrate 10 in the third embodiment, because of the existence of the first insulation film 21 of the reduced thickness at the bottom of the concave portion 21a. Therefore, when the semiconductor substrate 10 is made of silicon (Si) and the pad electrode 22 is made of aluminum (Al), a failure resulting from contact between the aluminum (Al) in the pad electrode 22 and the silicon (Si) in the semiconductor substrate 10, such as silicon nodules, can be prevented.

In addition, the top surface of the semiconductor substrate 10 is insulated from the pad electrode 22, regardless materials forming the semiconductor substrate 10 and the pad electrode 22. Therefore, the electronic device formed in the top surface of the semiconductor substrate 10 can be circuit-tested before the via hole 16 is formed.

Next, a supporting body 14 is formed on the pad electrode 22 through a resin layer 13 when necessary, as in the first embodiment. The supporting body 14 may be removed in a later process step. Or, the supporting body 14 may remain without being removed. Forming the supporting body 14 is not necessarily required and may be omitted. A second insulation film 15 is formed on a back surface of the semiconductor substrate 10, as in the first embodiment.

Figure 17:
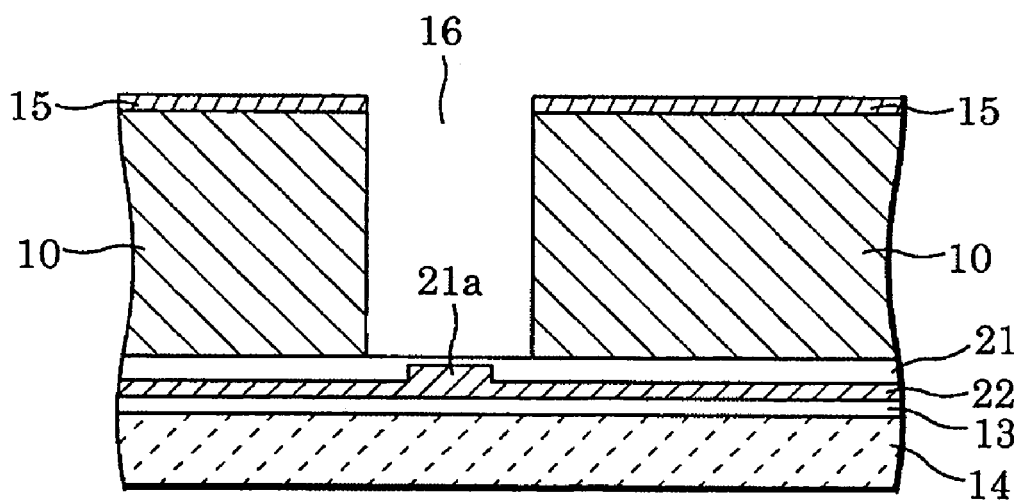
FIGS. 17-19 are cross-sectional views showing respective device intermediates at process steps following the process step of FIG. 16 and arranged in the sequence of the third embodiment of manufacturing method.

Next, as shown in FIG. 17, the second insulation film 15 and the semiconductor substrate 10 at the location corresponding to the concave portion 12a in the first insulation film 21 are etched using a photoresist layer (not shown) as a mask, as in the first embodiment. The etching forms a via hole 16 that penetrates through the second insulation film 15 and the semiconductor substrate 10 and has an aperture larger than the concave portion 21a in the first insulation film 21. Unlike the first embodiment, the first insulation film 21 is exposed at the bottom of the via hole 16.

Figure 18:
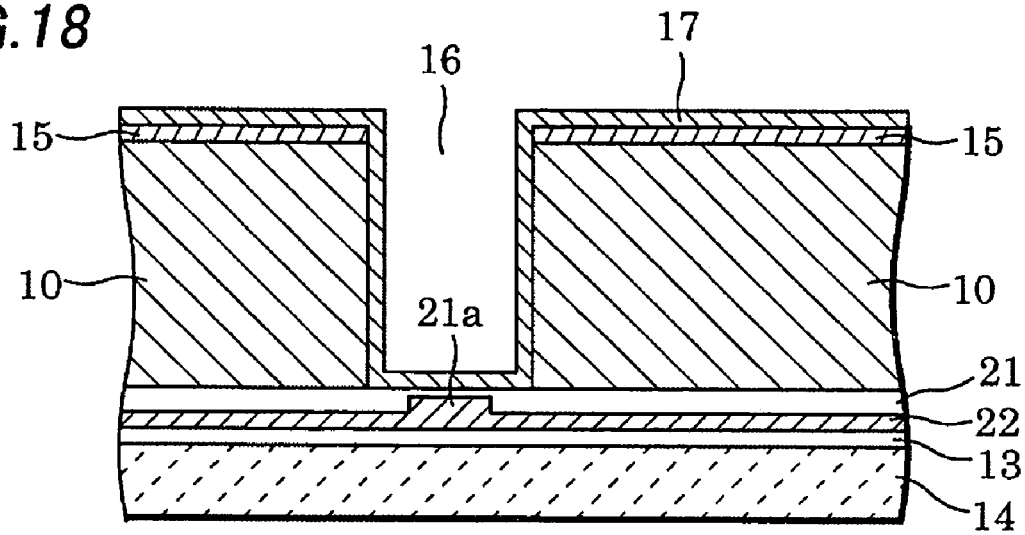

Next, as shown in FIG. 18, a third insulation film 17 is formed on a surface of the via hole 16 and on the second insulation film 15, as in the first embodiment.

Figure 19:
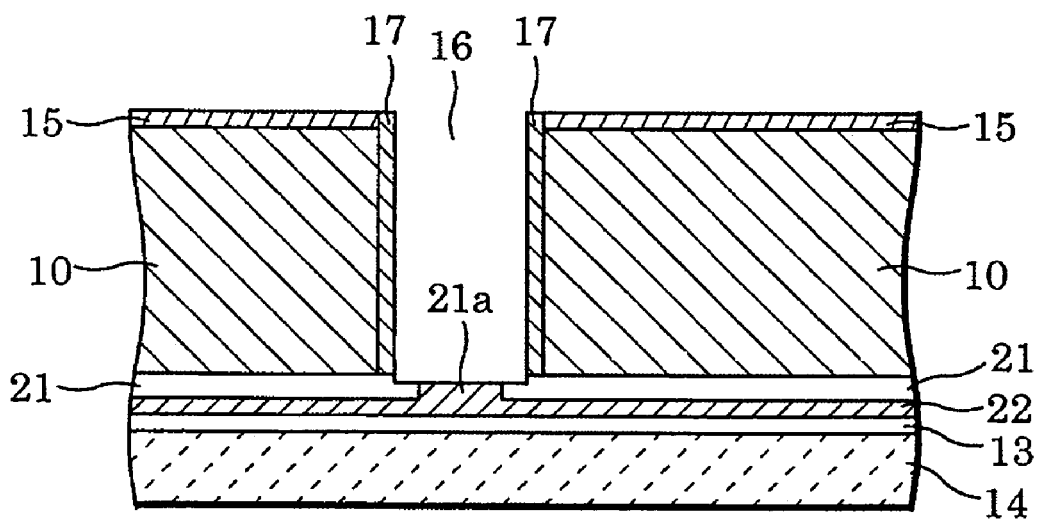

Next, as shown in FIG. 19, the third insulation film 17 is etched from the back surface side of the semiconductor substrate 10 preferably by anisotropic dry etching, as in the first embodiment. The third insulation film 17 formed on the second insulation film 15, the third insulation film 17 formed on the bottom of the via hole 16 and the first insulation film 21 of reduced thickness at the bottom of the via hole are removed by the etching. That is, a part of the pad electrode 22 is exposed at the bottom of the via hole 16, while the third insulation film 17 formed on a side wall of the via hole 16 remains. Also, a part of the first insulation film 21 is exposed around the exposed pad electrode 22 at the bottom of the via hole 16.

An amount and time of the etching increase slightly compared with the first embodiment, since the first insulation film 21 of reduced thickness is also removed in the third embodiment when the third insulation film 17 on the bottom of the via hole 16 is removed by the etching. However, the amount of the etching can be suppressed to the amount less than the amount required in the conventional art, since there is no need of two times of etching that are required in the conventional art to remove the first insulation film 51 and the third insulation film 57.

Next, a barrier/seed layer (not shown) is formed on the second insulation film 15 on the back surface of the semiconductor substrate 10 and on the surface of the via hole 16, as in the first embodiment. Furthermore, a through-hole electrode (not shown) and a wiring layer that is continuous to the through-hole electrode are formed on the barrier/seed layer (not shown), the wiring layer is shaped into a predetermined pattern and a conductive terminal (not shown) is formed on the wiring layer. The barrier/seed layer, the through-hole electrode, the wiring layer and the conductive terminal, that are not shown in the figure, are made of the same materials and formed by the same method as in the first embodiment.

Finally, the semiconductor substrate 10 and the stacked layers on it are diced and separated along a dicing line (not shown). With this, a plurality of semiconductor devices composed of semiconductor dice 10A and the stacked layers is completed.

According to the third embodiment, as described above, the pad electrode 22 is not in contact with the top surface of the semiconductor substrate 10. Therefore, a failure resulting from contact between the semiconductor substrate 10 and the pad electrode 22, such as silicon nodules, can be prevented from occurring.

Also, because the pad electrode 22 is insulated from the top surface of the semiconductor substrate 10, the electronic device (not shown) formed in the top surface of the semiconductor substrate 10 can be circuit-tested before the via hole 16 is formed.

In addition, only one time of etching is enough to complete the etching to expose the pad electrode 22 at the bottom of the via hole 16. Therefore, the amount of etching is suppressed to that less than the amount required in the conventional art, making control of the etching easier than the conventional art.

As a result, it is made possible in the manufacturing method of the semiconductor device having a through-hole electrode to reduce a manufacturing cost by simplifying the manufacturing process and to enhance yield of the semiconductor device.

Next, a manufacturing method of a semiconductor device according to a fourth embodiment of this invention will be explained hereinafter, referring to the drawings. FIGS. 20-23 are cross-sectional views showing the manufacturing method of the semiconductor device according the fourth embodiment. The same reference numerals are used for the common components in FIGS. 20-23 as in FIGS. 1-11 referred in the explanation of the first embodiment.

Figure 20:
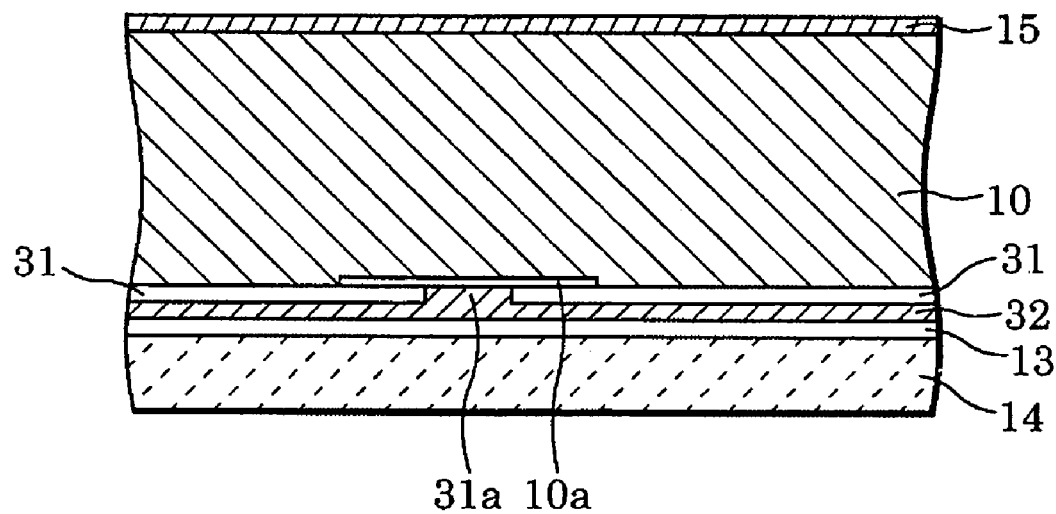
FIG. 20 is a cross-sectional view showing a device intermediate of a semiconductor device at a process step of a fourth embodiment of manufacturing method of this invention.

First, as shown in FIG. 20, the semiconductor substrate 10 having an electronic device (not shown) formed in its top surface is provided, as in the first embodiment. Next, a gate oxide film 10a is formed on the semiconductor substrate 10 at a predetermined location where a via hole 16, which will be described below, is to be formed. The gate oxide film 10a is made of a silicon dioxide ($SiO_2$) film by thermal oxidation, for example, or of other oxide film.

Although not shown in the figure, a gate electrode layer made of polysilicon, for example, may be formed instead of the gate oxide film 10a at the predetermined location on the semiconductor substrate 10 where the via hole 16, which will be described below, is to be formed. Or, a device isolation layer made of a silicon dioxide ($SiO_2$) film by thermal oxidation, a P-TEOS (Plasma-Tetra-Ethyl-Ortho-Silicate) film or a BPSG (Boro-Phospho-Silicate-Glass) film, for example, may be formed instead of the gate oxide film 10a at the predetermined location.

Next, a first insulation film 31, that is similar to the first insulation film 11 in the first embodiment, is formed over the top surface of the semiconductor substrate 10 including the electronic device and the gate insulation film 10a. Next, a portion of the first insulation film 31 in contact with the top surface of the semiconductor substrate 10 is selectively etched and removed. The portion mentioned above is situated at a location corresponding to the location on the semiconductor substrate 10 where the via hole is to be formed. The etching forms an opening 31a that exposes the gate insulation film 10a formed on the top surface of the semiconductor substrate 10.

Next, a pad electrode 32, that is connected with the electronic device (not shown) and serves as an electrode for external connection, is formed on the first insulation film 31 and inside of the opening 31a. The pad electrode 32 is made of aluminum (Al) formed by sputtering, for example, and is formed to extend from the bottom of the opening 31a onto the first insulation film 31, as the pad electrode 12 in the first embodiment.

Unlike the first embodiment, the pad electrode 32 is not in contact with the top surface of the semiconductor substrate 10 in the fourth embodiment, because of the gate oxide film 10a existing between the pad electrode 32 in the opening 31a and the top surface of the semiconductor substrate 10. Therefore, when the semiconductor substrate 10 is made of silicon (Si) and the pad electrode 32 is made of aluminum (Al), a failure resulting from contact between the aluminum (Al) in the pad electrode 32 and the silicon (Si) in the semiconductor substrate 10, such as silicon nodules, can be prevented from occurring.

Also, because the pad electrode 32 is insulated from the top surface of the semiconductor substrate 10 regardless materials forming the semiconductor substrate 10 and the pad electrode 32, the electronic device (not shown) formed in the top surface of the semiconductor substrate 10 can be circuit-tested before the via hole 16 is formed.

Next, a supporting body 14 is formed on the pad electrode 32 through a resin layer 13 when necessary, as in the first embodiment. The supporting body 14 may be removed in a later process step. Or, the supporting body 14 may remain without being removed. Forming the supporting body 14 is not necessarily required and may be omitted. A second insulation film 15 is formed on a back surface of the semiconductor substrate 10, as in the first embodiment.

Figure 21:
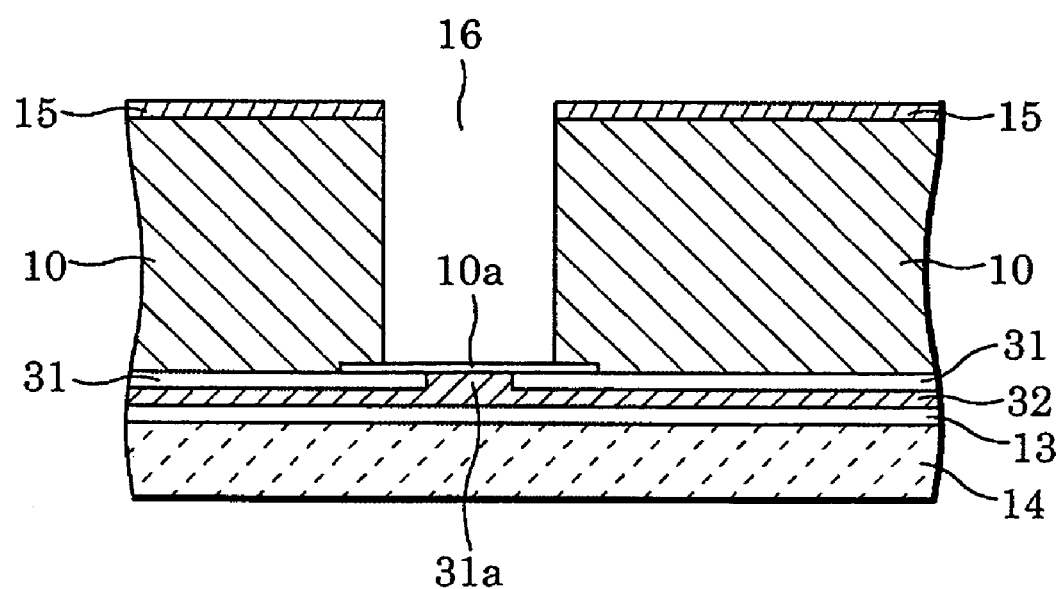
FIGS. 21-23 are cross-sectional views showing respective device intermediates at process steps following the process step of FIG. 20 and arranged in the sequence of the fourth embodiment of manufacturing method.

Next, as shown in FIG. 21, the second insulation film 15 and the semiconductor substrate 10 at the location corresponding to the opening 31a in the first insulation film 31 are etched using a photoresist layer (not shown) as a mask, as in the first embodiment. A via hole 16, which penetrates through the second insulation film 15 and the semiconductor substrate 10 and has an aperture larger than the opening 31a in the first insulation film 31, is formed by the etching. Unlike the first embodiment, the gate oxide film 10a is exposed at the bottom of the via hole 16.

Figure 22:
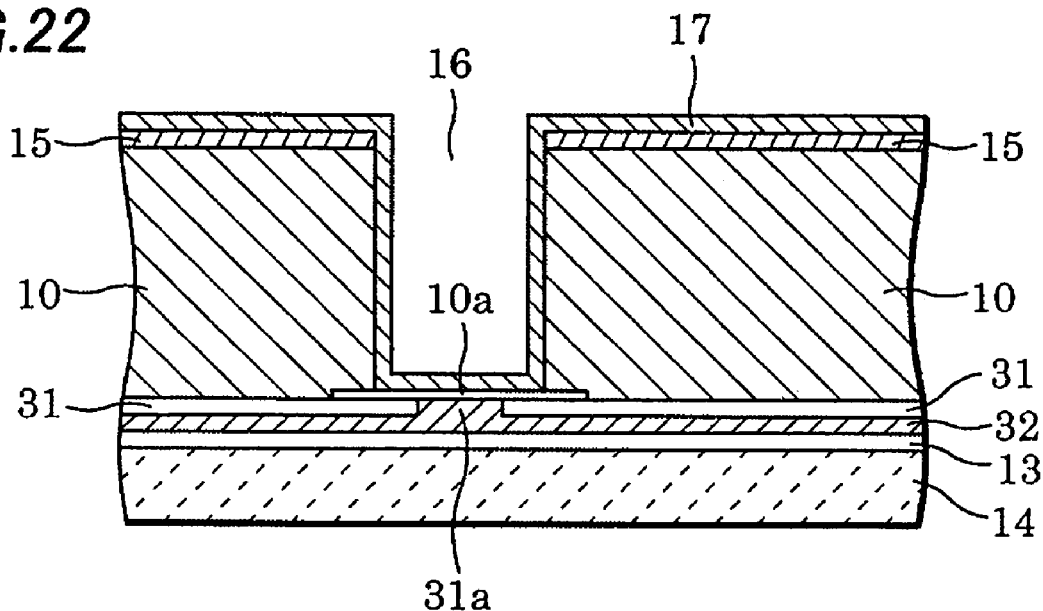

Next, as shown in FIG. 22, a third insulation film 17 is formed on a surface of the via hole 16 and on the second insulation film 15, as in the first embodiment.

Figure 23:
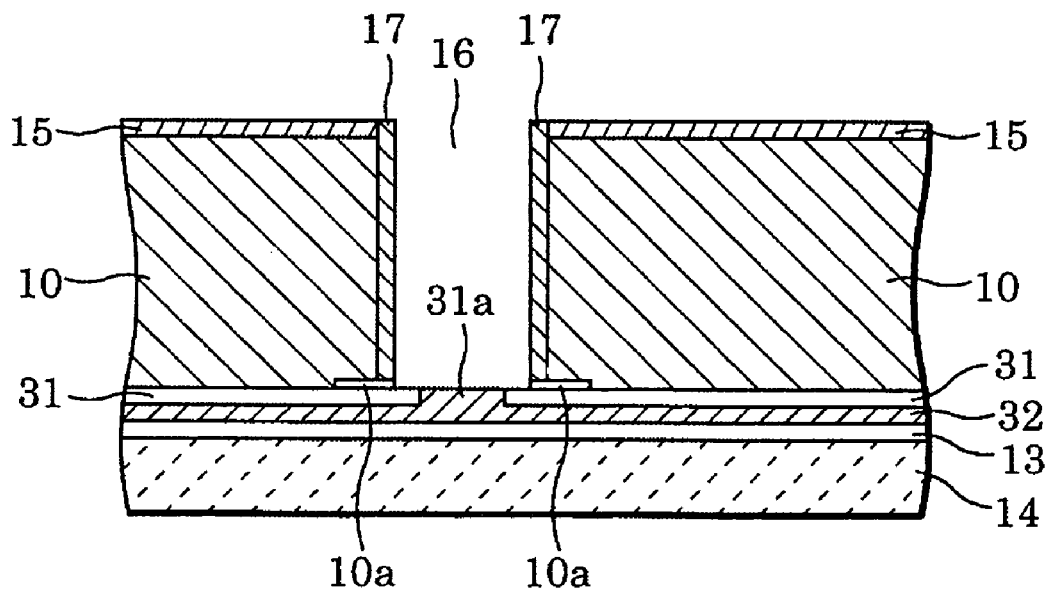
Figure 24:
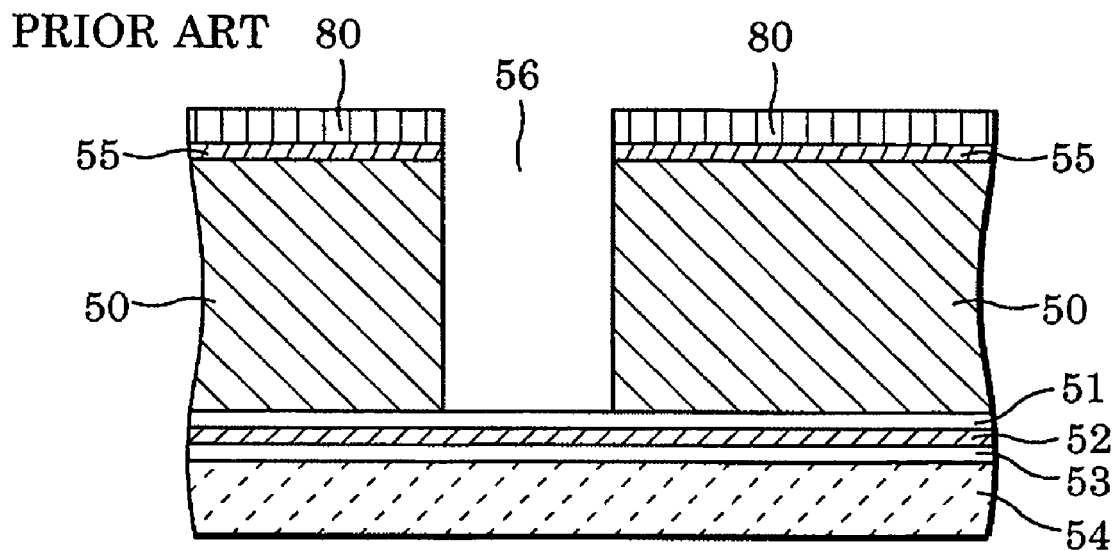
FIG. 24 is a cross-sectional view showing a device intermediate of a semiconductor device at a process step of a conventional manufacturing method.
Figure 25:
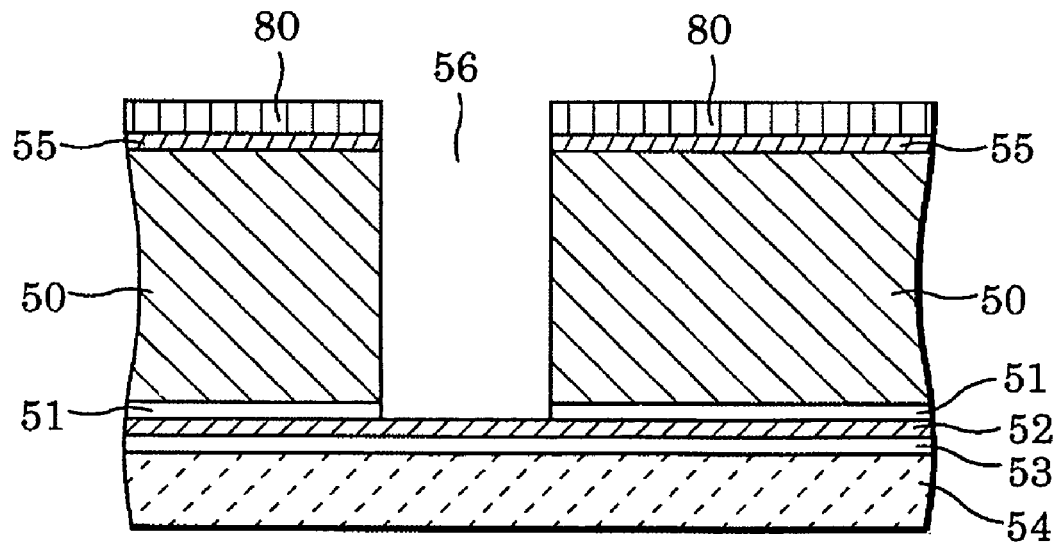
FIGS. 25-27 are cross-sectional views showing respective device intermediates at process steps following the process step of FIG. 24 and arranged in the sequence of the conventional manufacturing method.
Figure 26:
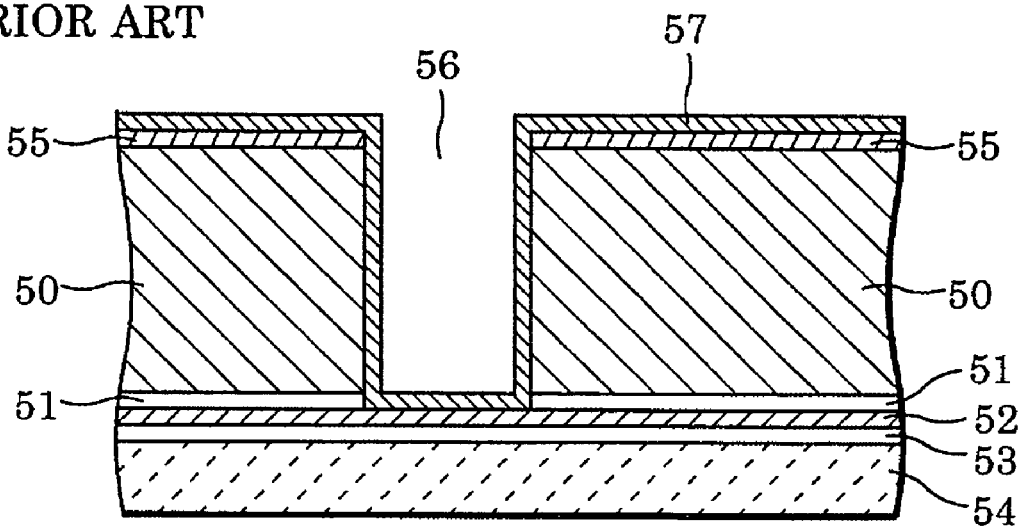
Figure 27:
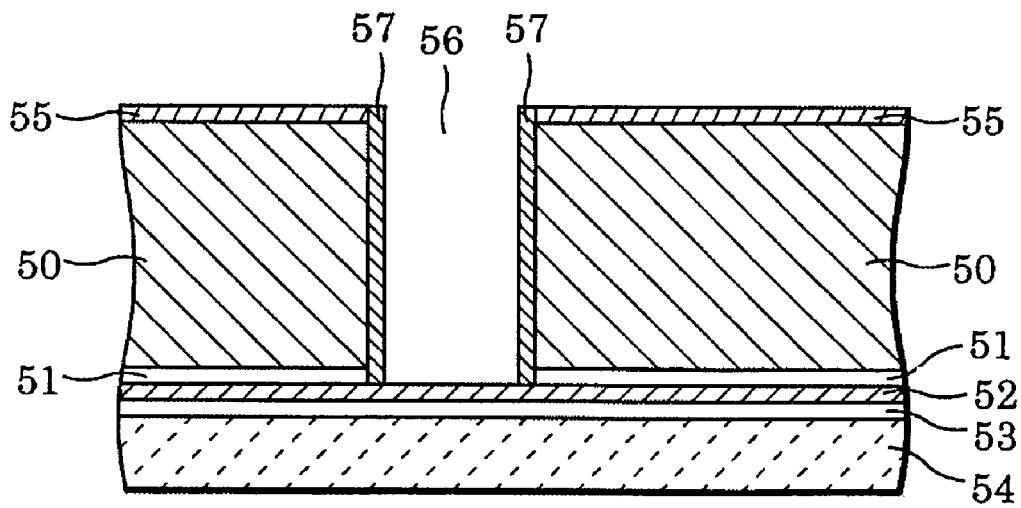

Next, as shown in FIG. 23, the third insulation film 17 is etched from the back surface side of the semiconductor substrate 10 preferably by anisotropic dry etching, as in the first embodiment. The third insulation film 17 formed on the second insulation film 15, the third insulation film 17 formed on the bottom of the via hole 16 and the gate oxide film 10a at the bottom of the via hole 16 are removed by the etching. That is, a part of the pad electrode 12 is exposed at the bottom of the via hole 16, while the third insulation film 17 formed on a side wall of the via hole 16 remains. Also, a part of the first insulation film 31 is exposed around the exposed pad electrode 12 at the bottom of the via hole 16.

An amount and time of the etching increase slightly compared with the first embodiment, since the gate oxide film 10a is also removed in the fourth embodiment when the third insulation film 17 on the bottom of the via hole 10 is removed by the etching. However, the amount of the etching can be suppressed to that less than the amount required in the conventional art, since there is no need of two times of etching that are required in the conventional art to remove the first insulation film 51 and the third insulation film 57.

Next, a barrier/seed layer (not shown) is formed on the second insulation film 15 on the back surface of the semiconductor substrate 10 and on the surface of the via hole 16, as in the first embodiment. Furthermore, a through-hole electrode (not shown) and a wiring layer that is continuous to the through-hole electrode are formed on the barrier/seed layer, the wiring layer is shaped into a predetermined pattern and a conductive terminal (not shown) is formed on the wiring layer. The barrier/seed layer, the through-hole electrode, the wiring layer and the conductive terminal, that are not shown in the figure, are made of the same materials and formed by the same method as in the first embodiment.

Finally, the semiconductor substrate 10 and the stacked layers on it are diced and separated along a dicing line (not shown). With this, a plurality of semiconductor devices composed of semiconductor dice 10A and the stacked layers is completed.

According to the fourth embodiment, as described above, the pad electrode 32 is not in contact with the top surface of the semiconductor substrate 10. Therefore, a failure resulting from contact between the semiconductor substrate 10 and the pad electrode 32, such as silicon nodules, can be prevented from occurring. Also, because the pad electrode 32 is insulated from the top surface of the semiconductor substrate 10 regardless materials forming the semiconductor substrate 10 and the pad electrode 32, the electronic device formed in the top surface of the semiconductor substrate 10 can be circuit-tested before the via hole 16 is formed.

In addition, only one time of etching is enough to complete the etching to expose the pad electrode 11 at the bottom of the via hole 16. Therefore, the amount of etching is suppressed to that less than the amount required in the conventional art, making control of the etching easier than the conventional art.

As a result, it is made possible in the manufacturing method of the semiconductor device having a through-hole electrode to reduce a manufacturing cost by simplifying the manufacturing process and to enhance yield of the semiconductor device.

The through-hole electrode 19 and the wiring layer 20 described in the first, second, third and fourth embodiments are not limited to be formed in the method described above, and may be formed by other method. For example, the through-hole electrode 19 and the wiring layer 20 may be formed by plating using a photoresist layer (not shown) for patterning the through-hole electrode 19 and the wiring layer 20 formed on a region of the barrier/seed layer 18 where the through-hole electrode 19 or the wiring layer 20 is not formed.

Also, the through-hole electrode 19 and the wiring layer 20 may be made of metal other than copper (Cu) by a method other than plating. For example, the through-hole electrode 19 and the wiring layer 20 may be formed by CVD. Or, the through-hole electrode 19 and the wiring layer 20 may be formed by tin (Sn) plating followed by copper (Cu) plating. Or, the through-hole electrode 19 and the wiring layer 20 may be made of aluminum (Al) or aluminum alloy and may be formed by sputtering, for example. Also, the through-hole electrode 19 and the wiring layer 20 may be formed in separate process steps.

And the first, second, third and fourth embodiments do not necessarily include forming the wiring layer 20 or forming the conductive terminal 22. That is, the wiring layer 20 or the conductive terminal 22 is not necessarily formed, as long as the through-hole electrode 19 exposed in the opening of the via hole 16 can be electrically connected to a circuit board (not shown). For example, the through-hole electrode 19 exposed in the opening of the via hole 16 may be connected to the circuit board without passing through the wiring layer 20 or the conductive terminal 22. Or, the through-hole electrode 19 may be connected to the circuit board through the conductive terminal 22 formed on the through-hole electrode 19 exposed in the opening of the via hole 16 without passing through the wiring layer 20.

According to the embodiments of this invention, only one time of etching is enough to complete the etching to expose the pad electrode at the bottom of the via hole. And when the insulation film at the bottom of the via hole is etched, the amount of etching required to securely expose the pad electrode can be suppressed to the minimum, making the control of the etching easier.

Also, according to the embodiments of this invention, the semiconductor substrate and the pad electrode are not in contact with each other, since the barrier metal layer is disposed between them. Therefore, a failure resulting from contact between the semiconductor substrate and the pad electrode, such as silicon nodules, can be prevented from occurring.

In addition, according to the embodiments of this invention, the top surface of the semiconductor substrate is insulated from the pad electrode by forming one of the insulation film of reduced thickness, the gate insulation film, the gate electrode and the device isolation layer between the semiconductor substrate and the pad electrode before the via hole is formed. As a result, the electronic device formed in the top surface of the semiconductor substrate can be circuit-tested before forming the via hole.

Thus, it is made possible in the manufacturing method of the semiconductor device having a through-hole electrode to reduce a manufacturing cost by simplifying the manufacturing process and to enhance yield of the semiconductor device.

What is claimed is:

1. A method of manufacturing a semiconductor device, comprising:
    forming a first insulation film on a front surface of a semiconductor substrate;
    forming an opening in the first insulation film by etching so as to expose part of the front surface of the semiconductor substrate;
    forming a pad electrode that is disposed in the opening and on the first insulation film;
    forming a second insulation film on a back surface of the semiconductor substrate;
    forming a via hole that penetrates through the second insulation film and the semiconductor substrate so as to expose part of the pad electrode disposed in the opening of the first insulation film and part of the first insulation film surrounding said part of the pad electrode disposed in the opening of the first insulation film;
    forming a third insulation film on a sidewall and a bottom of the via hole and on the second insulation film;
    etching the third insulation film so as to expose the part of the pad electrode disposed in the opening of the first insulation film;
    forming a through-hole electrode in the via hole, the through-hole electrode being electrically connected with the pad electrode; and
    dividing the semiconductor substrate to form at least a semiconductor die.

2. The method of claim 1, further comprising forming a wiring on the back surface of the semiconductor substrate so that the wiring is connected with the through-hole electrode.

3. The method of claim 2, further comprising forming a conductive terminal on the wiring.

4. A method of manufacturing a semiconductor device, comprising:
    forming a first insulation film on a front surface of a semiconductor substrate;
    removing part of the first insulation film by etching;
    forming a pad electrode on the first insulation film so as to fill the part of the first
    insulation film removed by the etching;
    forming a second insulation film on a back surface of the semiconductor substrate;
    forming a via hole above part of the pad electrode filling the removed part of the first insulation film, a lateral size of the via hole being larger than a lateral size of the removed part of the first insulation film;
    forming a third insulation film on a sidewall and a bottom of the via hole and on the second insulation film;
    removing the third insulation film at the bottom of the via hole;
    forming a through-hole electrode in the via hole so that the through-hole electrode is electrically connected with the pad electrode; and
    dividing the semiconductor substrate to form at least a semiconductor die.

5. A method of manufacturing a semiconductor device, comprising: forming a first insulation film on a front surface of a semiconductor substrate; forming an opening in the first insulation film by etching so as to expose part of the front surface of the semiconductor substrate; forming a barrier metal layer that is disposed in the opening and on the first insulation film; forming a pad electrode on the barrier metal layer; forming a second insulation film on a back surface of the semiconductor substrate; forming a via hole that penetrates through the second insulation film and the semiconductor substrate so as to expose part of the barrier metal layer disposed in the opening of the first insulation film and part of the first insulation film surrounding said part of the barrier metal layer disposed in the opening of the first insulation film; forming a third insulation film on a sidewall and a bottom of the via hole and on the second insulation film; etching the third insulation film so as to expose the part of the barrier metal layer disposed in the opening of the first insulation film; forming a through-hole electrode in the via hole, the through-hole electrode being electrically connected with the pad electrode through the barrier metal layer; and dividing the semiconductor substrate to form at least a semiconductor die.

6. The method of claim 5, further comprising forming a wiring on the back surface of the semiconductor substrate so that the wiring is connected with the through-hole electrode.

7. The method of claim 6, further comprising forming a conductive terminal on the wiring.

8. A method of manufacturing a semiconductor device, comprising: forming a first insulation film on a from surface of a semiconductor substrate; forming a recess in the first insulation film by etching; forming a pad electrode that is disposed in the recess and on the first insulation film; forming a second insulation film on a back surface of the semiconductor substrate; forming a via hole that penetrates through the second insulation film and the semiconductor substrate so as to expose part of the first insulation film that is underneath the recess and part of the first insulation film surrounding said part of the first insulation film underneath the recess; forming a third insulation film on a sidewall and a bottom of the via hole and on the second insulation film; etching the third insulation film and the first insulation film so as to expose the part of the pad electrode disposed in the recess; forming a through-hole electrode in the via hole, the through-hole electrode being electrically connected with the pad electrode; and dividing the semiconductor substrate to form at least a semiconductor die.

9. The method of claim 8, further comprising forming a wiring on the back surface of the semiconductor substrate so that the wiring is connected with the through-hole electrode.

10. The method of claim 9, further comprising forming a conductive terminal on the wiring.

11. A method of manufacturing a semiconductor device, comprising: forming a device element on a front surface of a semiconductor substrate; forming a first insulation film on the front surface of a semiconductor substrate so as to cover the device element; forming an opening in the first insulation film by etching so as to expose part of the device element; forming a pad electrode that is disposed in the opening and on the first insulation film; forming a second insulation film on a back surface of the semiconductor substrate; forming a via hole that penetrates through the second insulation film and the semiconductor substrate so as to expose part of the device element that is larger than the opening of the first insulation film; forming a third insulation film on a sidewall and a bottom of the via hole and on the second insulation film; etching the third insulation film and the device element so as to expose part of the pad electrode disposed in the opening of the first insulation film; forming a through-hole electrode in the via hole, the through-hole electrode being electrically connected with the pad electrode; and dividing the semiconductor substrate to form at least a semiconductor die.

12. The method of claim 11, further comprising forming a wiring on the back surface of the semiconductor substrate so that the wiring is connected with the through-hole electrode.

13. The method of claim 12, further comprising forming a conductive terminal on the wiring.

14. The method of claim 11, wherein the device element is a gate oxide film, a gate electrode or a device isolation layer.

* * * * *